United States Patent
Munakata

(10) Patent No.: US 7,863,719 B2
(45) Date of Patent: Jan. 4, 2011

(54) WAFER LEVEL CHIP SCALE PACKAGE

(75) Inventor: Koji Munakata, Sakura (JP)

(73) Assignee: Fujikura Ltd., Tokyo (JP)

(*) Notice: Subject to any disclaimer, the term of this patent is extended or adjusted under 35 U.S.C. 154(b) by 0 days.

(21) Appl. No.: 12/848,652

(22) Filed: Aug. 2, 2010

(65) Prior Publication Data

US 2010/0295175 A1    Nov. 25, 2010

Related U.S. Application Data

(62) Division of application No. 12/163,581, filed on Jun. 27, 2008, now Pat. No. 7,791,187.

(30) Foreign Application Priority Data

Jun. 29, 2007    (JP) ............................. 2007-171914

(51) Int. Cl.
    H01L 23/06    (2006.01)
    H01L 21/00    (2006.01)

(52) U.S. Cl. .................. 257/684; 257/701; 257/774; 257/786; 257/E23.011; 257/E23.019; 257/E23.145; 438/110; 438/125

(58) Field of Classification Search .................. None
    See application file for complete search history.

(56) References Cited

U.S. PATENT DOCUMENTS

| 5,260,517 | A | 11/1993 | Cathey |
|---|---|---|---|
| 5,464,794 | A | 11/1995 | Lur et al. |
| 5,925,931 | A * | 7/1999 | Yamamoto .................. 257/737 |
| 6,181,569 | B1 | 1/2001 | Chakravorty |
| 6,559,540 | B2 | 5/2003 | Kawashima |
| 7,390,688 | B2 | 6/2008 | Wakabayashi et al. |
| 2004/0094841 | A1* | 5/2004 | Matsuzaki et al. .......... 257/758 |
| 2004/0238926 | A1 | 12/2004 | Obinata |
| 2005/0194687 | A1 | 9/2005 | Yamaguchi |

FOREIGN PATENT DOCUMENTS

| EP | 0538619 A1 | 4/1993 |
|---|---|---|
| JP | 11-307694 A | 11/1999 |
| JP | 2000353716 A | 12/2000 |
| JP | 2004207368 A | 7/2004 |
| KR | 10-0385766 B1 | 7/2001 |

* cited by examiner

*Primary Examiner*—Alonzo Chambliss
(74) *Attorney, Agent, or Firm*—Sughrue Mion, PLLC

(57) ABSTRACT

A semiconductor device of the invention includes a semiconductor substrate having a first insulating section formed on one surface thereof. A first conductive section is disposed on the one surface of the semiconductor substrate. A second insulating section is superimposed over the first insulating section and covers the first conductive section. A second conductive section is superimposed over the second insulating section. A third insulating section is disposed over the second insulating section and covers the second conductive section. These first conductive section, second insulating section, second conductive section, third insulating section, and terminal altogether constitute a structure. A third opening is formed between adjacent structures. The third opening is formed passing through the third and second insulating sections to expose the first insulating section.

4 Claims, 6 Drawing Sheets

WAFER LEVEL CHIP SCALE PACKAGE

CROSS REFERENCE TO RELATED APPLICATIONS

This application is a Divisional Application of U.S. patent application Ser. No. 12/163,581 filed Jun. 27, 2008, which claims priority to Japanese Patent Application No. 2007-171914 filed Jun. 29, 2007. The contents of all are incorporated herein by reference.

BACKGROUND OF THE INVENTION

1. Field of the Invention

Apparatuses consistent with the present invention relate to a semiconductor device, and more particularly, to a semiconductor device used for a wafer-level CSP or the like that requires no wiring board (e.g., interposer).

2. Description of Related Art

In most related art semiconductor devices, a package structure in which a semiconductor chip is sealed by resin and metal leads arranged on side surfaces in the vicinity of the sealing resin, is used. However, in this package structure, the area of the package becomes larger than that of the semiconductor chip. Therefore, in recent years, a package structure called CSP (chip-scale package/chip-size package) has become widely used.

In the CSP, a ball grid array (BGA) technique is employed in which electrodes are flatly arranged on a flat surface of a package. The BGA technique allows semiconductor chips each having the same number of electrode terminals and the same projected area as those of conventional chips to be mounted on an electronic circuit board in a smaller area with high integration density. Since the area of the package is nearly the same as that of the semiconductor chip, the CSP can largely contribute to the development of small, light-weight electronic equipment.

A silicon wafer having wiring thereon is diced into semiconductor chips, and the chips are then individually packaged to form CSP chips. A package structure called a wafer-level CSP includes, on a silicon wafer, an insulating layer, a rewiring layer (i.e., conductive layer), a sealing layer, solder bumps (i.e., terminals), or the like. In the final process of fabrication, the wafer is diced into chips of a predetermined size such that the area of the package is nearly the same as that of the semiconductor chip (see Japanese Unexamined Patent Application, Publication No. 2004-207368).

In the thus-structured CSPs, the rewiring layer is kept insulated by the insulating layer and the sealing layer formed on almost entire of the substrate, such as a silicon wafer. However, the insulating layer and the sealing layer are usually formed of resin. Since resin layers can contract during curing, or undergo elastic deformation when heated, stress is generated between the insulating layer and the sealing layer, and the substrate. Such stress may cause curvature of the substrate or separation of the insulating layer and the sealing layer from the substrate. To address such a problem, Japanese Unexamined Patent Application, Publication No. 2000-353716 discloses a semiconductor device in which the insulating layer and the sealing layer are divided into sections by grooves for each terminal (i.e., bump) that is to be exposed, thereby reducing curvature in the substrate.

In the above-disclosed semiconductor device, however, since only narrow grooves are formed on the insulating layer and the sealing layer, elastic deformation of these layers cannot be absorbed completely, and thus curvature of the substrate cannot be prevented completely. In addition, since the exposed terminals (i.e., bumps) are divided only by narrow grooves, the terminals which are highly integrated may become short-circuited to one another.

SUMMARY OF THE INVENTION

In view of the aforementioned, an exemplary object of the invention is to provide a semiconductor device in which curvature of a substrate due to elastic deformation of an insulating layer or separation of the insulating layer from the substrate can be prevented, and insulation between terminals can be improved.

An exemplary aspect of the invention relates to a semiconductor device which includes: a semiconductor substrate covered with a first insulating section at one surface thereof; and a structure which includes: a first conductive section disposed on the one surface of the semiconductor substrate; a second insulating section superimposed over the first insulating section and having a first opening to expose the first conductive section; a second conductive section superimposed over the second insulating section and electrically connected to the first conductive section through the first opening; a third insulating section superimposed over the second conductive section and having a second opening to expose a portion of the second conductive section; and a terminal disposed at the second opening, in which: a plurality of the structures are disposed over the semiconductor substrate; and between at least a pair of adjacent structures, a third opening is provided passing through the second insulating section and the third insulating section to expose the first insulating section.

In an exemplary embodiment of the semiconductor device of the invention, the third opening may be formed to at least partially separate the adjacent structures.

In an exemplary embodiment of the semiconductor device of the invention, the third opening may be formed such that the structure surrounds the terminal and is formed in a discrete island configuration when seen in a plan view.

In an exemplary embodiment of the semiconductor device of the invention, the structures adjacent to one another may be joined and the third opening formed between the structures may have a discrete configuration.

Another exemplary aspect of the invention relates to a semiconductor device which includes: a semiconductor substrate covered with a first insulating section at one surface thereof; and a plurality of structures provided over the semiconductor substrate, in which: each of the structures includes a first conductive section disposed on the one surface of the semiconductor substrate, a second insulating section superimposed over the first insulating section and having a first opening to expose the first conductive section, a second conductive section superimposed over the second insulating section and electrically connected to the first conductive section through the first opening, a third insulating section superimposed over the second conductive section and having a second opening to expose a portion of the second conductive section, and a terminal disposed at the second opening; between at least a pair of adjacent structures, a third opening is provided passing through the second insulating section to expose the first insulating section; and the third insulating section connects at least a pair of adjacent structures and covers the third opening.

According to an exemplary embodiment of the semiconductor device of the invention, any stress generated due to elastic deformation of the third and second insulating sections can be absorbed by the third opening provided passing through these third and second insulating sections. In the process of preparing these third and second insulating sections, the material of the third and second insulating sections may contract during curing. The contraction is significant especially when these third and second insulating sections are formed of resin.

As a result of the contraction, large stress is generated between the semiconductor substrate and the third and second insulating sections. The stress may cause curvature of the substrate, or if the stress is larger, the third and second insulating sections may separate from the semiconductor substrate, thereby damaging the semiconductor device itself.

The stress, resulting from different degree of elastic deformation between the third and second insulating sections and the semiconductor substrate, however, can be alleviated effectively by the third opening. The third opening is formed passing through these third and second insulating sections, and has a bottom which is large enough to expose the first insulating section. The third opening can absorb large stress that may be generated between the third and second insulating sections and the semiconductor substrate so as to prevent curvature of the substrate or separation of the third and second insulating sections from the semiconductor substrate.

Electrical malfunction such as short circuit between terminals due to current leakage can also be prevented by the third opening provided among highly integrated terminals.

Exemplary embodiments of the present invention may solve the above identified problems but an embodiment of the present invention need not solve these identified problems or any other problems.

DETAILED DESCRIPTION OF EXEMPLARY EMBODIMENTS

Figure 1A:
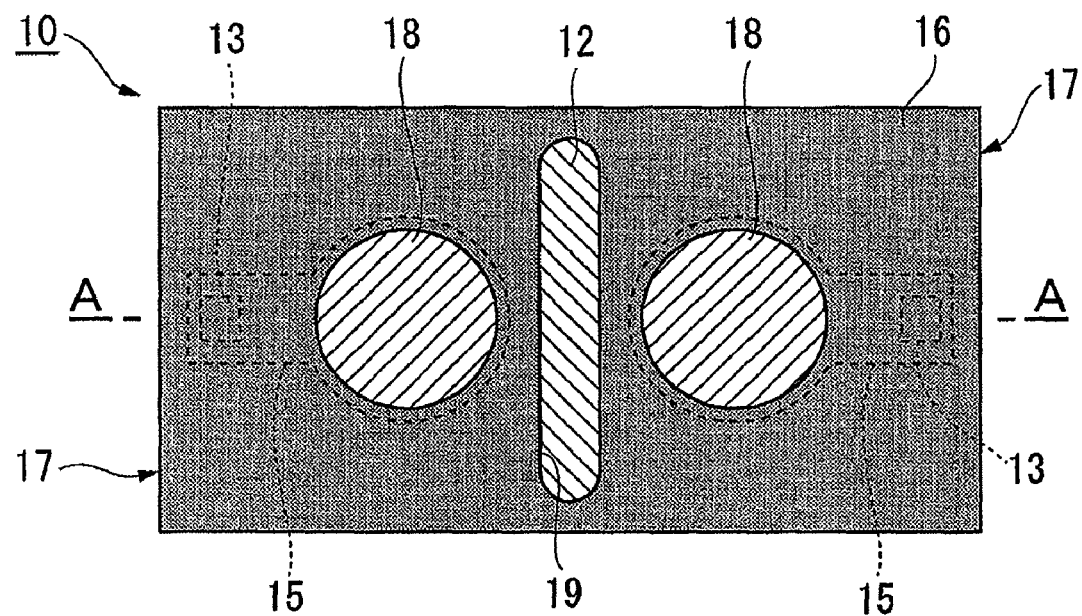
FIG. 1A is a plan view of an exemplary embodiment of a semiconductor device of the invention.

Referring now to the drawings, exemplary embodiments of the semiconductor device according to the invention will be described. However, the invention is not limited to the described embodiments. For the ease of explanation, some of the main components are enlarged in the drawings, and therefore the components are not necessarily shown in scale.

Figure 1B:
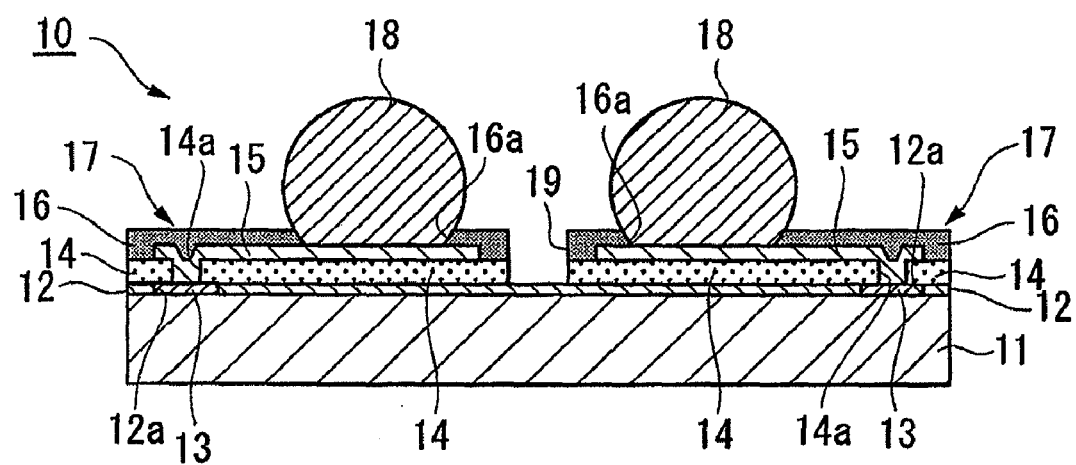
FIG. 1B is a cross-sectional view of an exemplary embodiment of the semiconductor device of the invention.

FIG. 1A is a plan view of a CSP semiconductor device as an example of the invention. FIG. 1B is a cross-sectional view taken along line A-A in FIG. 1A. A semiconductor device 10 of the invention includes a semiconductor substrate 11 having a first insulating section (i.e., passivation film) 12 formed on one surface thereof. An electrode (hereinafter referred to as "first conductive section") 13 is provided on a part of the semiconductor substrate 11 and is electrically connected to an integrated circuit (not shown) formed in the semiconductor substrate 11. The first insulating section 12 has an electrode opening 12a through which the first conductive section 13 is exposed.

A second insulating section 14 is superimposed over the first insulating section 12. The second insulating section 14 has a first opening 14a through which a part of the first conductive section 13 is exposed. A rewiring layer (hereinafter referred to as "second conductive section") 15 is superimposed over the second insulating section 14. The second conductive section 15 is electrically connected to the first conductive section 13 via the first opening 14a.

A third insulating section (i.e., sealing layer) 16 is disposed over the second insulating section 14 to cover the second conductive section 15. The third insulating section 16 has a second opening 16a through which a part of the second conductive section 15 is exposed. A terminal (i.e., bump) 18 is disposed on the second conductive section 15 where the second conductive section 15 is exposed through the second opening 16a. The terminal 18 is electrically connected to the second conductive section 15.

These first conductive section 13, second insulating section 14, second conductive sections 15, third insulating sections 16, and terminal 18 altogether constitute a structure 17. Multiple structures 17 are provided on the semiconductor substrate 11. In the present embodiment, these structures 17 are arranged adjacent to one another.

A third opening 19 is formed between adjacent structures 17. The third opening 19 is formed passing through the third insulating section 16 and the second insulating section 14 to expose the first insulating section 12.

According to the semiconductor device 10 of the invention, the impact of the stress generated by elastic deformation of the third insulating section 16 and the second insulating section 14 can be reduced by the third opening 19 formed passing through these third and second insulating sections 16 and 14. In the process of preparing these third and second insulating sections 16 and 14, the material of the third and second insulating sections 16 and 14 may contract during curing. The contraction is significant especially when these third and second insulating sections 16 and 14 are formed of resin.

When the third and second insulating sections 16 and 14 contract, a large stress is generated between the semiconductor substrate 11 and the third and second insulating sections 16 and 14. The stress may cause curvature of the semiconductor substrate 11, or if the stress is larger, the third and second insulating sections 16 and 14 may separate from the semiconductor substrate 11, thereby damaging the semiconductor device 10 itself.

The stress, resulting from different degrees of elastic deformation between the insulating sections 16, 14 and the semiconductor substrate 11, however, can be alleviated effectively by the third opening 19, which is formed between adjacent structures 17. The third opening 19 is formed passing through the third and second insulating sections 16 and 14, and has a bottom which is large enough to expose the first insulating section 12. Accordingly, the semiconductor substrate 11 is not easily affected by the stress that may be generated between the third and second insulating sections 16, 14 and the semiconductor substrate 11. Thus, curvature of the semiconductor substrate 11 or separation of the third and second insulating sections 16 and 14 from the semiconductor substrate 11 can be effectively prevented.

Temperature changes may occur in the usage environment of the semiconductor device 10 to generate stress between the semiconductor substrate 11, which undergoes smaller elastic deformation, and the third and second insulating sections 16 and 14, which undergo larger elastic deformation. The stress due to temperature changes is also alleviated effectively by the third opening 19. In this manner, curvature of the semiconductor substrate 11 or separation of the third and second insulating sections 16 and 14 from the semiconductor substrate 11 can be effectively prevented.

Electrical malfunction such as short circuit between the terminals 18 due to current leakage can also be prevented by the third opening 19 formed between the structures 17, 17. In addition, since the first insulating section 12, on which the first conductive section 13 constituting a semiconductor circuit is formed, is exposed through the third opening 19, the third opening 19 promotes effective radiation of heat generated near the first conductive section 13.

The semiconductor substrate 11 may be a semiconductor wafer, such as a silicon wafer, for example.

The first conductive section 13 is formed of a conductive material such as copper or aluminum. The first conductive section 13 may be 0.3 to 1.5 micrometers thick. The first insulating section (i.e., passivation film) 12, which covers the semiconductor substrate 11, may be formed of SiN provided over an entire surface of the semiconductor substrate 11.

The second insulating section 14 may be formed of insulating resin such as polyimide, epoxy resin and silicon resin. The second insulating section 14 may be formed by the spin-coating method, the laminating method, the printing method, or the like. The second insulating section 14 may be 3 to 50 micrometers thick.

The second conductive section (i.e., rewiring layer) 15 may be formed of a conductive material such as copper, aluminum, nickel, and gold. The second conductive section 15 may be formed by electro plating, electroless plating, or the like. The second conductive section 15 may be 3 to 50 micrometers thick.

The third insulating section (i.e., sealing layer) 16 may be formed of insulating resin such as polyimide, epoxy resin, and silicon resin. The third insulating section 16 may be formed by the spin-coating method or the laminating method using photosensitive resin. The third insulating section 16 may be 3 to 150 micrometers thick.

After forming the third insulating section 16 and the second insulating section 14, the third opening 19 may be formed by etching the third insulating section 16 and the second insulating section 14 using a resist mask. Alternatively, the third insulating section 16 and the second insulating section 14 may previously include an opening that will serve as the third opening 19.

Figure 2A:
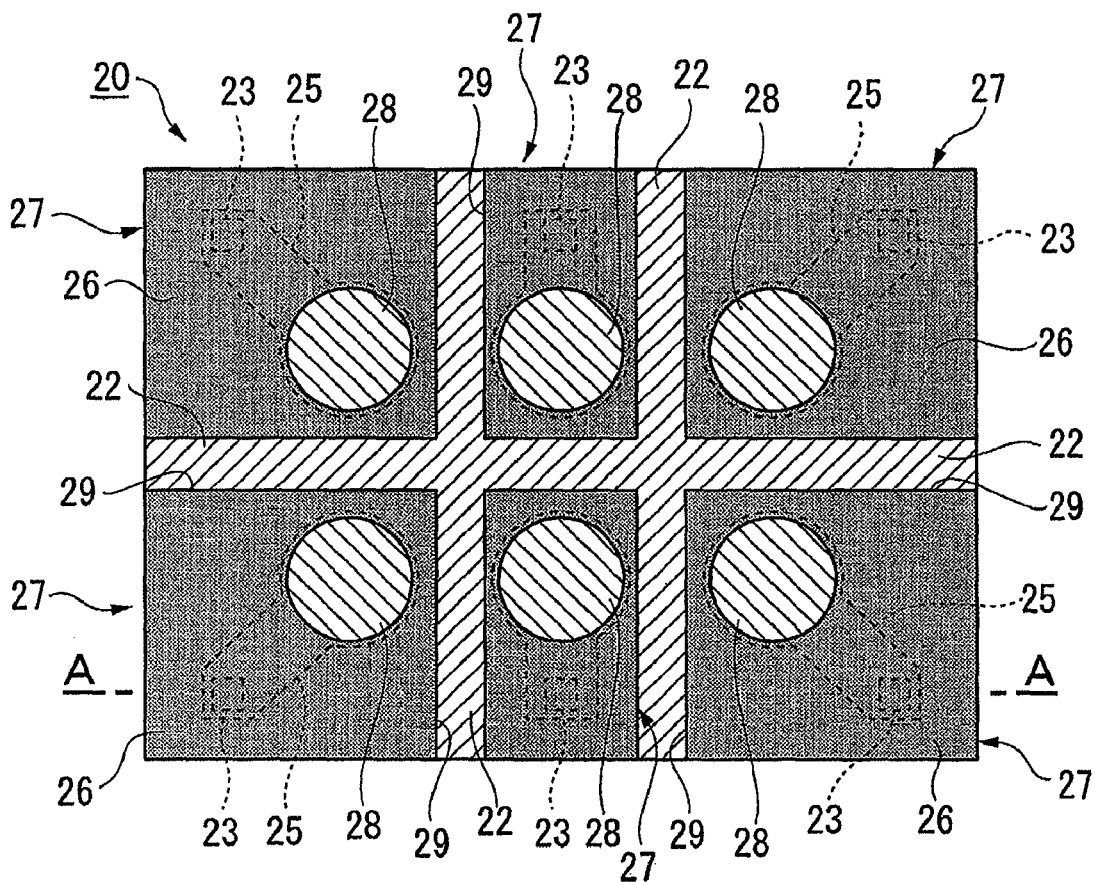
FIG. 2A is a plan view of another exemplary embodiment of a semiconductor device of the invention.
Figure 2B:
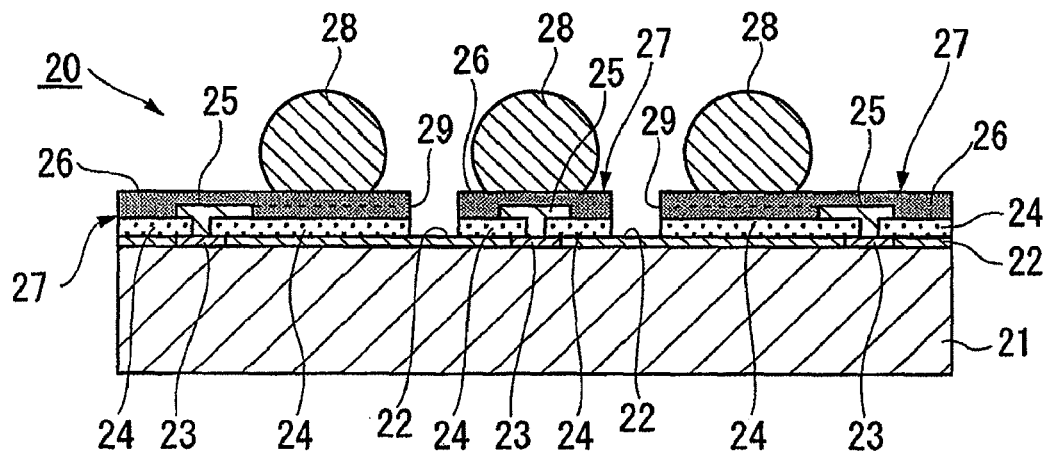
FIG. 2B is a cross-sectional view of another exemplary embodiment of the semiconductor device of the invention.

FIG. 2A is a plan view of another example of the semiconductor device of the invention. FIG. 2B is a cross-sectional view taken along line A-A in FIG. 2A. In a semiconductor device 20 of the present embodiment, a first conductive section (i.e., electrode) 23 is provided near the circumference of a semiconductor substrate 21, and a second conductive section (i.e., rewiring layer) 25 is formed to extend from the first conductive section 23 toward the center of the substrate 21. A terminal (i.e., bump) 28 is formed at one end of the second conductive section 25.

These first conductive section 23, second insulating section 24, second conductive section 25, third insulating section 26, and terminal 28 altogether constitute a structure 27. Multiple structures 27 are arranged spaced apart from one another on the substrate 21. A third opening 29 is formed between adjacent structures 27. The third opening 29 is formed passing through the third insulating section 26 and the second insulating section 24 to expose the first insulating section (i.e., passivation film) 22. The third opening 29 defines each of the structures 27 to a rectangular shape. That is, the third opening 29 structurally separates adjacent structures 27.

The present embodiment also includes the third opening 29 that individuates the structures 27 and exposes the first insulating section 22. Thus, stress that may be generated due to temperature change between the substrate 21, which undergoes smaller elastic deformation, and the third and second insulating sections 26 and 24, which undergo larger elastic deformation, can be effectively alleviated. In this manner, curvature of the substrate 21 or separation of the third and second insulating sections 26 and 24 from the substrate 21 can be effectively prevented.

The third opening may alternatively be formed such that a structure, having a first conductive section, a second insulating section, a second conductive section, a third insulating section, and a terminal, is formed so as to surround the terminal (i.e., bump). The second and third insulating sections surrounding the terminal may be partially joined to adjacent second and third insulating sections respectively (see FIG. 4), or may be separated from one another (see FIGS. 3 and 5).

As the third opening is formed in this manner, the second and third insulating sections are made discontinuous, which also helps reducing curvature of the substrate due to deformation of these insulating sections.

Figure 3:
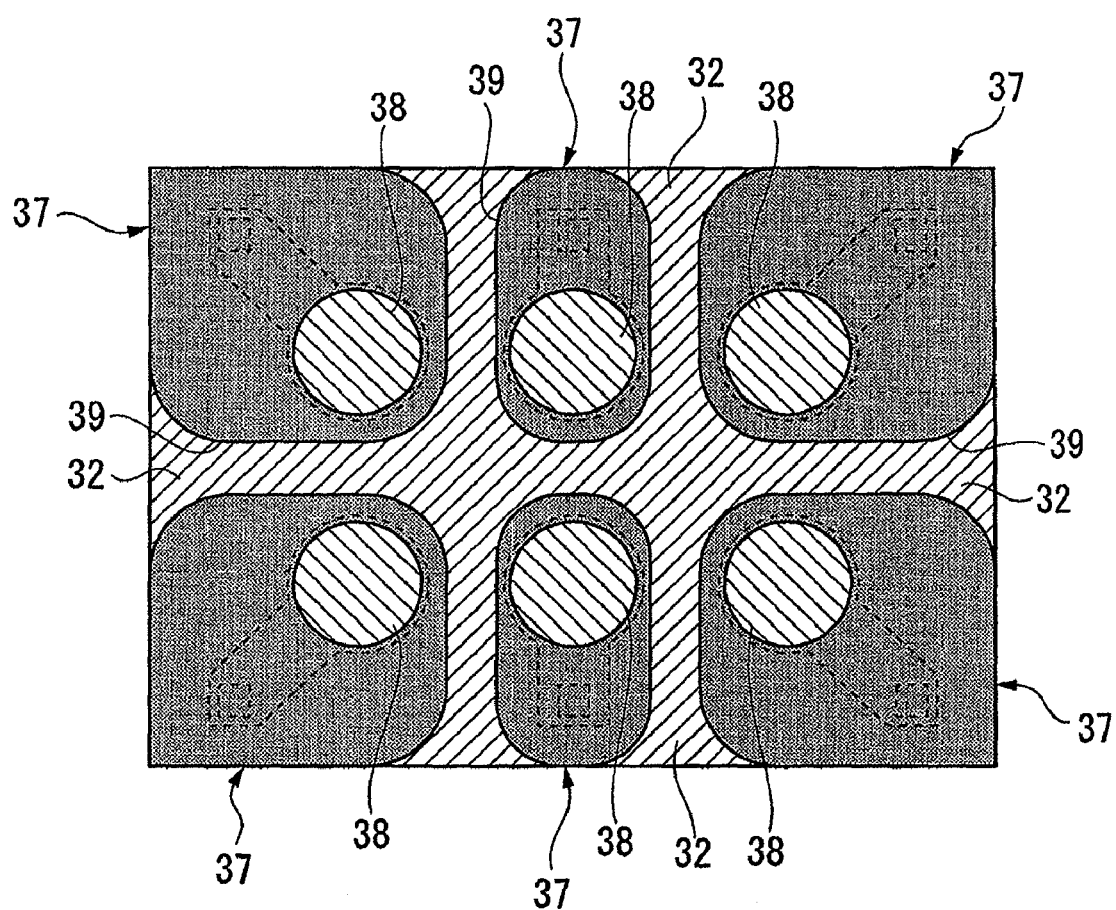
FIG. 3 is a plan view of another exemplary embodiment of the semiconductor device of the invention.

As shown in FIG. 3, a third opening 39 may be formed such that each of structures 37, including a first conductive section, a second insulating section, a second conductive section, a third insulating section, and a terminal (i.e. bump) 38, is defined in an island configuration. In this configuration, a wider area of the first insulating section (i.e., passivation film) 32 is exposed, and the third opening 39 has improved capability of alleviating the stress. Since the structures 37 are arranged in the island configuration, the structure 37 is smaller in size than the structure 27 shown in FIG. 2. Corners of each island of the structure 37 may be chamfered or curved. In this manner, deformation of the second and third insulating sections can be reduced, and the stress can be alleviated in an improved manner.

It should be noted that these structures 37 are not necessarily separated completely from one another, but the third opening 39 is formed so as to separate at least a part between adjacent structures. In this configuration, the semiconductor device may have partially different inter-terminal pitches.

Figure 4:
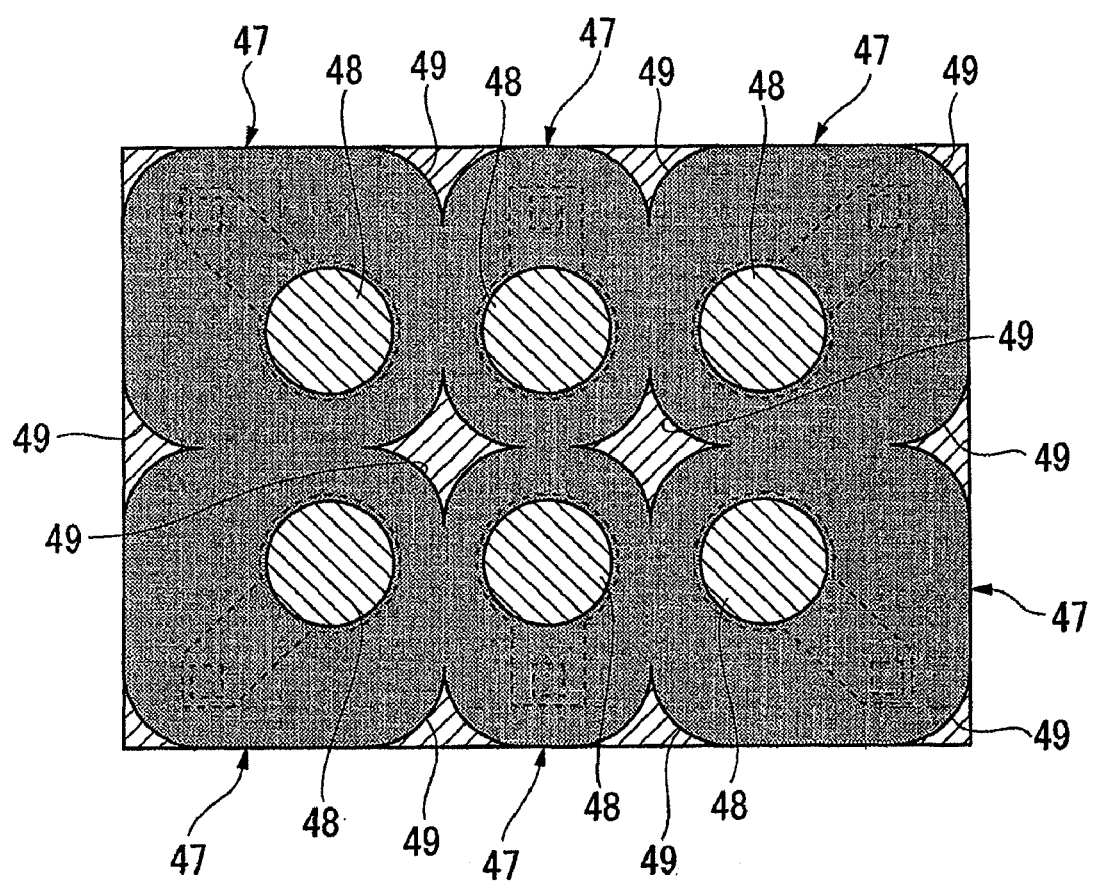
FIG. 4 is a plan view of another exemplary embodiment of the semiconductor device of the invention.

Alternatively, as shown in FIG. 4, adjacent structures 47 each including a first conductive section, a second insulating section, a second conductive section, a third insulating section, and a terminal (i.e. bump) 48 may be joined to each other. In this case, a third opening 49 formed between the structures 47 has a discrete configuration. The structure 47 has curvature surfaces in this embodiment. Corners of the rectangular structure may be chamfered or curved to leave no sharp corners, at which deformations are easily concentrated, like those of the structure 27 shown in FIG. 2. Thus, curvature of the substrate due to the stress focusing on certain areas can be prevented.

Figure 5:
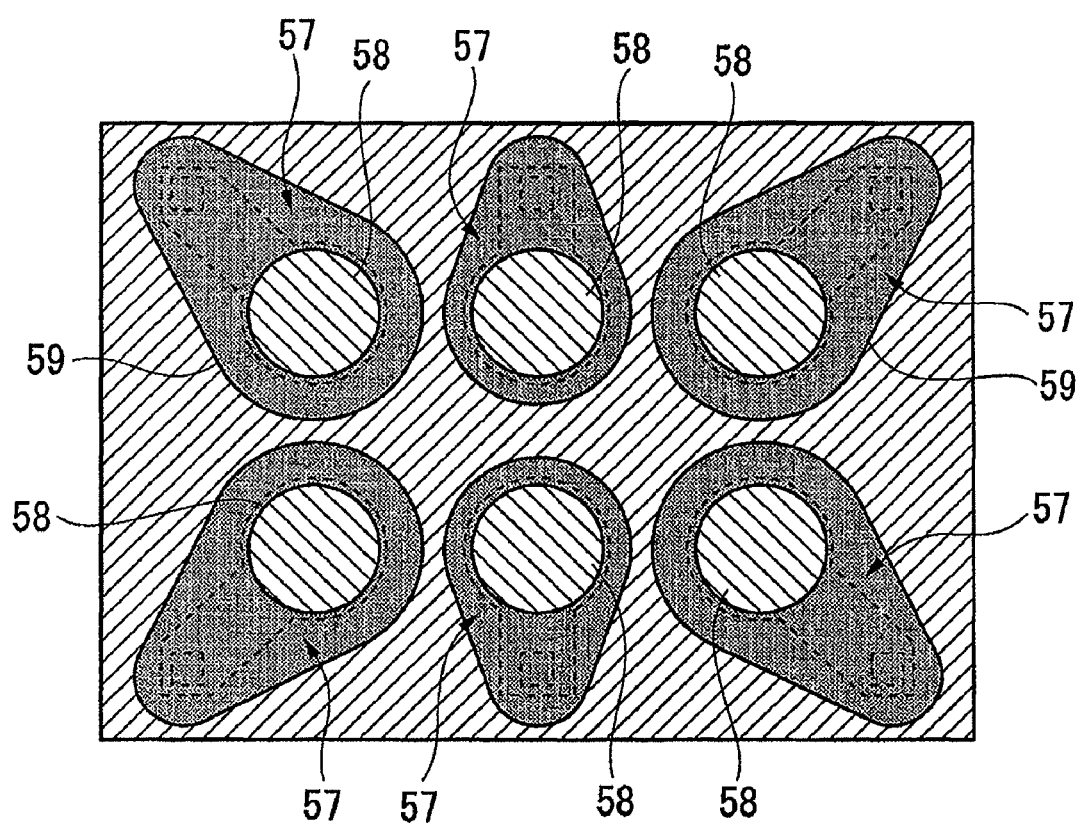
FIG. 5 is a plan view of another exemplary embodiment of the semiconductor device of the invention.

As shown in FIG. 5, each of structures 57 including a first conductive section, a second insulating section, a second conductive section, a third insulating section, and a terminal (i.e. bump) 58 may be formed in a smaller island configuration than that of the embodiment shown in FIG. 3. In this configuration, a third opening 59 is increased in size and has further improved capability of alleviating the stress.

Figure 6A:
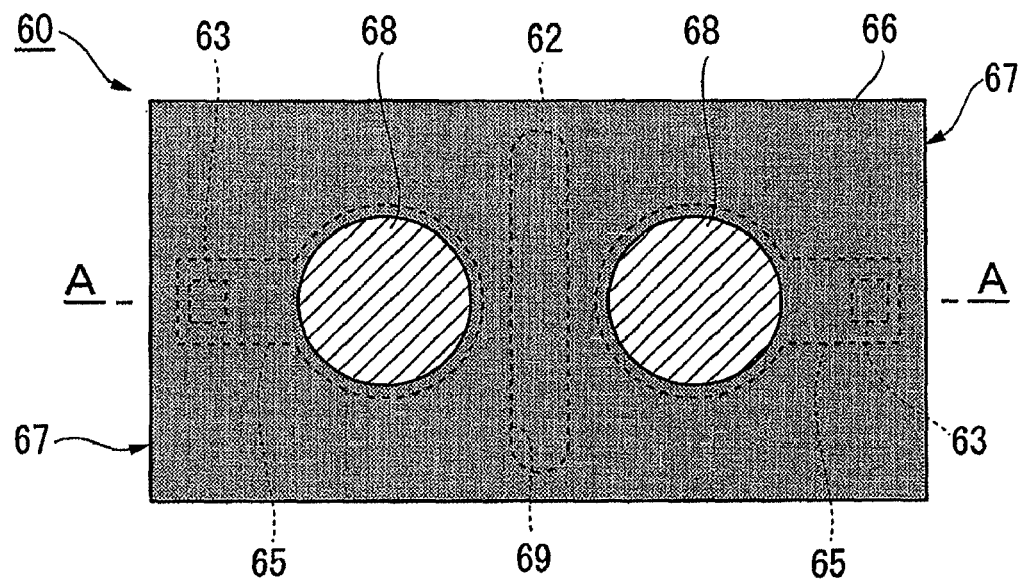
FIG. 6A is a plan view of another exemplary embodiment of the semiconductor device of the invention.
Figure 6B:
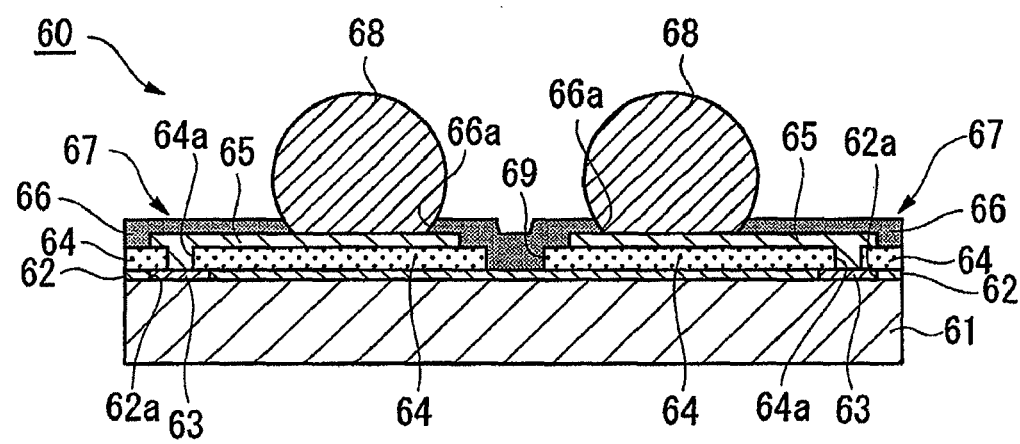
FIG. 6B is a cross-sectional view of another embodiment of the semiconductor device of the invention.

FIG. 6A is a plan view of a CSP semiconductor device as another example of the invention. FIG. 6B is a cross-sectional view taken along line A-A in FIG. 6A. A semiconductor device 60 of the invention includes a semiconductor substrate 61 having a first insulating section (i.e., passivation film) 62 formed on one surface thereof. An electrode (hereinafter referred to as "first conductive section") 63 is provided on a part of the semiconductor substrate 61 and is electrically connected to an integrated circuit (not shown) formed on the semiconductor substrate 61. The first insulating section 62 has an electrode opening 62a through which the first conductive section 63 is exposed.

A second insulating section 64 is superimposed over the first insulating section 62. The second insulating section 64 has a first opening 64a through which a part of the first conductive section 63 (electrode) is exposed. A rewiring layer (hereinafter referred to as "second conductive section") 65 is superimposed over the second insulating section 64. The second conductive section 65 is electrically connected to the first conductive section 63 via the first opening 64a.

A third insulating section (i.e., sealing layer) 66 is disposed over the second insulating section 64 to cover the second conductive section 65. The third insulating section 66 has a second opening 66a through which a part of the second conductive section 65 is exposed. A terminal (i.e., bump) 68 is disposed on the second conductive section 65 where the second conductive section 65 is exposed through the second opening 66a. The terminal 68 is electrically connected to the second conductive section 65.

These first conductive section 63, second insulating section 64, second conductive sections 65, third insulating sections 66, and terminal 68 altogether constitute a structure 67. Multiple structures 67 are provided on the semiconductor substrate 61. In the present embodiment, these structures 67 are arranged adjacent to one another.

A third opening 69 is formed between adjacent structures 67. The third opening 69 is formed passing through the second insulating section 64 to expose the first insulating section 62. The third insulating section 66 is formed to cover the third opening 69 and to connect the adjacent structures 67. That is, the third insulating section 66 is formed as a layer extending over the multiple structures 67.

With this configuration, insulation of the entire semiconductor device 60 may be improved. In addition, since the third insulating section 66 connects (i.e., covers) the structures 67 at upper sides thereof, rigidity of the semiconductor device 60 can be enhanced.

In the above, exemplary embodiments of the invention have been explained; but the invention is not limited to these embodiments. Various additions, omissions, substitutions, and other modifications to the configuration can be made, without deviating from the gist of the invention. The invention is not limited by the above explanation, but is limited only by the scope of the attached claims.

What is claimed is:

1. A semiconductor device comprising:
   a semiconductor substrate;
   a first insulating section disposed on a first surface of the semiconductor substrate; and
   a plurality of structures
   wherein each of the structures comprises:
      a first conductive section disposed on the first surface of the semiconductor substrate;
      a second insulating section disposed over the first insulating section;
      a second conductive section disposed over the second insulating section and electrically connected to the first conductive section through an opening in the second insulating section;
      a third insulating section disposed over the second conductive section; and
      a terminal electrically connected to the second conductive section through an opening in the third insulating section; and;
   an opening between at least one pair of adjacent structures passing through the second insulating section, thus exposing the first insulating section,
   wherein the third insulating section connects the at least one pair of adjacent structures and covers the opening between the at least one pair of adjacent structures.

2. The semiconductor device of claim 1, wherein the second insulating section of at least one of the plurality structures is contiguously formed with a corresponding second insulating section of an adjacent structure.

3. The semiconductor device of claim 1, wherein the second insulating section of at least one of the plurality of structures is isolated from a corresponding second insulating section of an adjacent structure.

4. The semiconductor device according to claim 1, wherein at least one of the second insulating section and the third insulating section comprises an insulating resin.

* * * * *